United States Patent
Gewinner et al.

(10) Patent No.: US 9,938,115 B2
(45) Date of Patent: Apr. 10, 2018

(54) SYSTEM AND METHOD FOR LIMITING OVER-VOLTAGE IN POWER SUPPLY SYSTEM

(71) Applicant: Otis Elevator Company, Farmington, CT (US)

(72) Inventors: Juergen Gewinner, Berlin (DE); Peter Herkel, Berlin (DE)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 15/104,810

(22) PCT Filed: Dec. 19, 2013

(86) PCT No.: PCT/US2013/076492
§ 371 (c)(1),
(2) Date: Jun. 15, 2016

(87) PCT Pub. No.: WO2015/094272
PCT Pub. Date: Jun. 25, 2015

(65) Prior Publication Data
US 2017/0029241 A1    Feb. 2, 2017

(51) Int. Cl.
*B66B 1/30* (2006.01)
*B66B 1/34* (2006.01)
(Continued)

(52) U.S. Cl.
CPC .............. *B66B 1/30* (2013.01); *B66B 1/3446* (2013.01); *B66B 5/0031* (2013.01);
(Continued)

(58) Field of Classification Search
CPC ....... B66B 1/30; B66B 1/3446; B66B 5/0031; B66B 5/0087
(Continued)

(56) References Cited

U.S. PATENT DOCUMENTS

| 5,229,558 A | 7/1993 | Hakala |
| 6,947,266 B1 * | 9/2005 | Billingsley ............ H02H 5/105 361/104 |

(Continued)

FOREIGN PATENT DOCUMENTS

| CN | 101752840 A | 6/2010 |
| EP | 1831092 A1 | 9/2007 |

(Continued)

OTHER PUBLICATIONS

International Search Report for application, dated Sep. 22, 2014, PCT/US2013/076492, 3 pages.
(Continued)

Primary Examiner — David Warren
(74) Attorney, Agent, or Firm — Cantor Colburn LLP

(57) ABSTRACT

A system and method for providing a protective extra low voltage power supply in an elevator system (2) is disclosed. The power supply system (10) may include a switch mode power supply (12) configured to provide an output voltage, a first voltage monitor (18) and a second voltage monitor (20). Each of the first voltage monitor (18) and the second voltage monitor (20) may be configured to receive the output voltage and determine an over-voltage condition at the switch mode power supply (12).

13 Claims, 3 Drawing Sheets

(51) Int. Cl.
  *B66B 5/00* (2006.01)
  *G01R 19/165* (2006.01)
  *B66B 9/00* (2006.01)
  *B66B 1/28* (2006.01)

(52) U.S. Cl.
  CPC .......... *B66B 5/0087* (2013.01); *G01R 19/165* (2013.01); *B66B 1/28* (2013.01); *B66B 9/00* (2013.01)

(58) Field of Classification Search
  USPC ........................................................ 187/289
  See application file for complete search history.

(56) References Cited

U.S. PATENT DOCUMENTS

| | | | | |
|---|---|---|---|---|
| 7,145,316 B1* | 12/2006 | Galinski | ............... | H02M 3/156 323/224 |
| 9,570,994 B1* | 2/2017 | Mao | ................... | H02M 3/33546 |
| 2002/0118234 A1* | 8/2002 | DeMoor | ................ | B41J 29/393 347/5 |
| 2002/0141209 A1* | 10/2002 | Bridge | ............. | H02M 3/33592 363/89 |
| 2003/0174520 A1* | 9/2003 | Bimbaud | ............ | H02M 3/3385 363/19 |
| 2004/0056643 A1* | 3/2004 | Loef | .................. | G01R 31/3631 323/288 |
| 2005/0237680 A1* | 10/2005 | Egner | ....................... | H02H 3/33 361/42 |
| 2005/0280405 A1* | 12/2005 | Bray | ........................ | H03H 1/02 323/312 |
| 2006/0239048 A1* | 10/2006 | Carter | ....................... | G05F 3/18 363/123 |
| 2007/0035282 A1* | 2/2007 | Petersen | ............. | H02M 1/4208 323/282 |
| 2007/0103132 A1* | 5/2007 | Hendrix | ................... | H02J 1/102 323/282 |
| 2008/0043504 A1* | 2/2008 | Ye | ...................... | H02M 3/33507 363/97 |
| 2009/0066303 A1* | 3/2009 | Smith | ..................... | G01R 31/40 323/274 |
| 2009/0127029 A1* | 5/2009 | Oesterle | .................. | B66B 5/021 187/290 |
| 2009/0231895 A1* | 9/2009 | Hu | ....................... | H02M 3/33592 363/127 |
| 2010/0006378 A1* | 1/2010 | Blasko | ...................... | B66B 1/30 187/290 |
| 2010/0134132 A1* | 6/2010 | Price | .................. | G01R 19/1659 324/755.01 |
| 2011/0181253 A1* | 7/2011 | Isham | ................ | G01R 19/0092 323/234 |
| 2012/0085593 A1* | 4/2012 | Schoenauer | ............ | B66B 5/027 187/254 |
| 2012/0200968 A1* | 8/2012 | Altemose | ............... | H02J 7/0026 361/86 |
| 2012/0249112 A1* | 10/2012 | Langeslag | ........... | H02M 3/1563 323/311 |
| 2012/0287682 A1* | 11/2012 | Zhang | ............... | H02M 3/33507 363/21.16 |
| 2013/0044521 A1 | 2/2013 | Zhao et al. | | |
| 2013/0094248 A1* | 4/2013 | Jacques | ................. | H02M 3/337 363/19 |
| 2013/0270045 A1* | 10/2013 | Herkel | ...................... | B66B 1/14 187/306 |
| 2014/0071714 A1* | 3/2014 | Li | ..................... | H02M 3/33507 363/16 |
| 2014/0112030 A1* | 4/2014 | Fahlenkamp | ..... | H02M 3/33507 363/21.14 |
| 2014/0265582 A1* | 9/2014 | Hyypio | ................. | H02M 1/10 307/52 |
| 2014/0281593 A1* | 9/2014 | Hayes | ................... | H02M 3/156 713/300 |
| 2015/0188439 A1* | 7/2015 | Muhlenbrock | ... | H02M 3/33592 363/17 |
| 2015/0372585 A1* | 12/2015 | Kutschak | ................ | H02M 1/36 363/21.12 |
| 2016/0078818 A1* | 3/2016 | Kang | ................... | G09G 3/3291 345/212 |

FOREIGN PATENT DOCUMENTS

| | | | | |
|---|---|---|---|---|
| WO | WO 2005031957 A1 * | 4/2005 | ......... | H02M 3/1588 |
| WO | 2011124745 A1 | 10/2011 | | |
| WO | 2012164597 A1 | 12/2012 | | |
| WO | 2013052051 A1 | 4/2013 | | |

OTHER PUBLICATIONS

Written Opinion for application, dated Sep. 22, 2014, PCT/US2013/076492, 6 pages.
European Search Report for application EP 13899570.9, dated Aug. 23, 2017, 7pgs.
Chinese First Office Action and Search Report for application CN 201380081740.6, dated Nov. 17, 2017, 13 pages.

\* cited by examiner

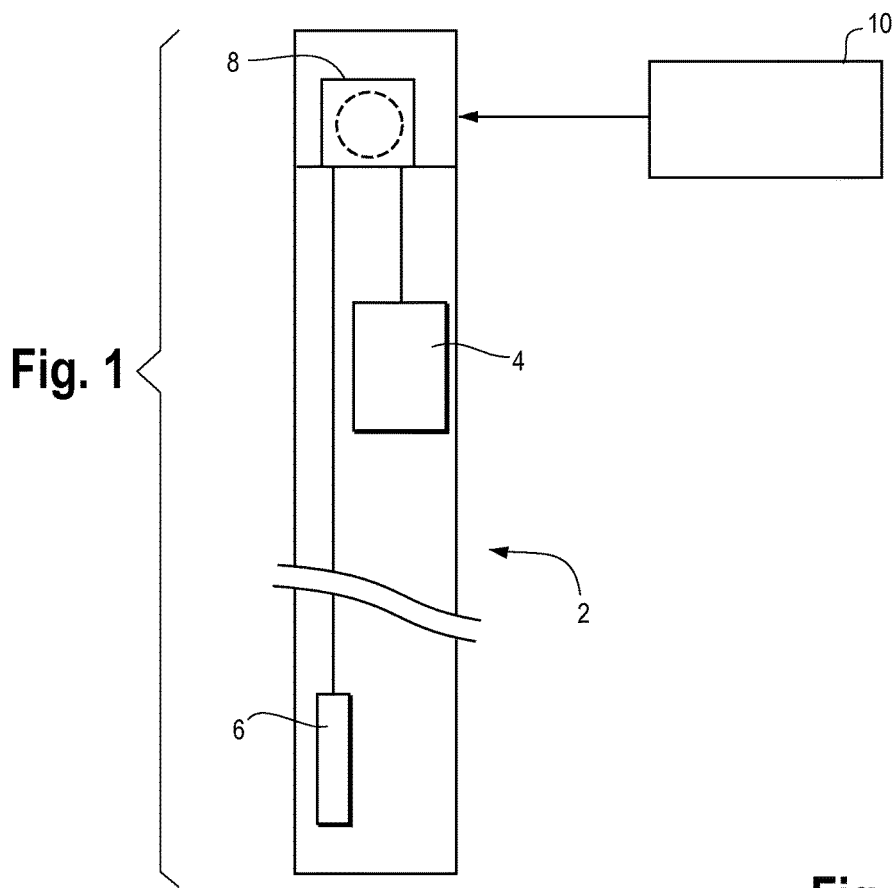
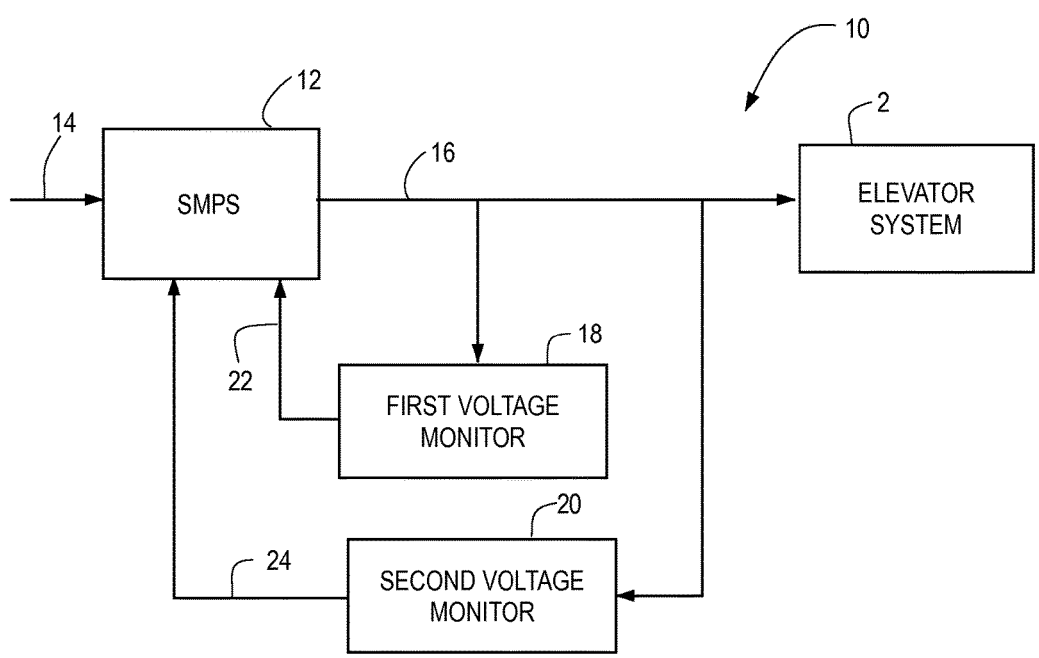

SYSTEM AND METHOD FOR LIMITING OVER-VOLTAGE IN POWER SUPPLY SYSTEM

FIELD OF THE DISCLOSURE

The present disclosure relates generally to power supply systems and, more particularly, relates to a system and method for limiting over-voltage conditions in power supply systems.

BACKGROUND OF THE DISCLOSURE

Elevator systems are widely used for transporting people or goods from one point to another. An elevator system typically includes an elevator car connected to a counterweight by hoisting ropes that move the elevator car vertically in an elevator shaft or hoistway. The hoisting ropes extend over a sheave or machine. A motor connected to the machine provides power to move the elevator car between two positions. The machine (and specifically the motor of the machine) is provided with a brake system to control the motion of the elevator car and to stop the elevator car as desired. The elevator car, motor, brake system, and other electrical components of the elevator system are supplied power via a power supply system connected at least indirectly to the elevator system.

Traditionally, the power supply system has been a transformer that receives a line voltage (such as from a power mains) which it converts to a voltage level suitable for use by the various components of the elevator system. Advantageously, the transformer is able to limit the output voltage that is supplied to the elevator system to a desired voltage level. However, the efficiency of the transformer often varies with the electrical load, going down, sometimes significantly, at standby operation of the elevator system. Further, transformers are often big, heavy, and costly to operate and maintain.

To circumvent at least some of the disadvantages of traditional transformers, in recent times, a switch mode power supply to power the elevator system has been used. A typical alternating current to direct current switch mode power supply may include a rectifier to convert incoming alternating current line voltage to direct current voltage, which may then be chopped or switched periodically using a power transistor to obtain a smooth direct current voltage signal. The direct current voltage signal may then be inverted back into an alternating current voltage signal to be passed through the windings of a transformer and a rectifier to obtain the desired direct current output voltage. Such a switch mode power supply has several advantages. For example, the switch mode power supply can provide higher efficiency even at lower electrical loads because the switching power transistor dissipates little power. Other advantages include smaller size and lighter weight and lower heat generation due to higher efficiency. However, unlike a traditional transformer, the output voltage from the switch mode power supply may be difficult to limit to a desired voltage level.

The International Electrotechnical Commission (IEC) regulates the maximum output voltage that a power supply component, such as the switch mode power supply can generate. Specifically, the IEC states that the output voltage from a power supply component cannot exceed the extra low voltage under normal conditions and under single-fault conditions in the power supply component. Thus, to protect from electric shock, the IEC requires that a power supply component provide a protective extra low voltage (PELV) by limiting the maximum output voltage to a ripple-free sixty volts of direct current (60 VDC) under dry conditions.

Accordingly, it would be beneficial if a switch mode power supply capable of providing a protective extra low voltage in accordance with the IEC standard could be developed.

SUMMARY OF THE DISCLOSURE

In accordance with one aspect of the present disclosure, a power supply system is disclosed. The power supply system may include a switch mode power supply configured to provide an output voltage, a first voltage monitor and a second voltage monitor. Each of the first voltage monitor and the second voltage monitor may be configured to receive the output voltage and determine an over-voltage condition at the switch mode power supply.

In some embodiments, the first voltage monitor and the second voltage monitor may compare the output voltage against a reference voltage to determine the over-voltage condition at the switch mode power supply. The first voltage monitor and the second voltage monitor may also be configured to turn the switch mode power supply off if the over-voltage condition is detected.

In other embodiments, one of the first voltage monitor and the second voltage monitor may be implemented using a comparator and the other one of the first voltage monitor and the second voltage monitor may be implemented using a micro control unit. For example, in some embodiments, the first voltage monitor may be implemented using the comparator and the second voltage monitor may be implemented using the micro control unit.

In additional embodiments, the comparator may be configured to receive the output voltage and a reference voltage and output a signal indicating the higher one of the output voltage and the reference voltage.

In yet other embodiments, the micro control unit may be configured to compare the output voltage against a reference voltage and, output a signal indicating the higher one of the output voltage and the reference voltage.

In further embodiments, the first voltage monitor and/or the second voltage monitor may include a test switch configured to input a test voltage instead of the output voltage into the respective first and/or the second voltage monitors when the test switch is closed. The test voltage may be configured to simulate the over-voltage condition at the switch mode power supply.

In accordance with another aspect of the present disclosure, a method for providing extra low voltage power supply is disclosed. The method may include providing a switch mode power supply configured to provide an output voltage, a first voltage monitor and a second voltage connected at least indirectly to the switch mode power supply and supplying the output voltage to the first voltage monitor and the second voltage monitor. The method may also include determining an over-voltage condition at the switch mode power supply by the first voltage monitor and the second voltage monitor and turning the switch mode power supply off if the first voltage monitor or the second voltage monitor detect the over-voltage condition.

In some embodiments, determining the over-voltage condition by the first voltage monitor and the second voltage monitor may include determining whether the output voltage exceeds a threshold and turning the switch mode power supply off when the output voltage exceeds the threshold.

In additional embodiments, determining whether the output voltage exceeds the threshold may include comparing the output voltage with a reference voltage and determining the larger one of the output voltage and the reference voltage. In some embodiments, comparing the output voltage with the reference voltage may be performed by a comparator, while in other embodiments the comparing may be performed by a micro control unit.

In accordance with yet another aspect of the present disclosure, an elevator system is disclosed. The elevator system may include an elevator car and a power supply system configured to supply protective extra low voltage to the elevator car. The power supply system may include a switched mode power supply configured to provide an output voltage to the elevator car, a first voltage monitor and a second voltage monitor, the first and the second voltage monitors may be configured to detect an over-voltage condition at the switch mode power supply and turn the switch mode power supply off if the over-voltage condition is detected.

In some embodiments, the switch mode power supply may be connected to a main power supply and configured to convert power from the main power supply into the output voltage.

In other embodiments, the second voltage monitor may provide a redundant switch off path to the switch mode power supply if the first voltage monitor malfunctions.

In further embodiments, the first voltage monitor and the second voltage monitor may prevent the output voltage from going over approximately sixty volts of direct current.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the exemplary embodiments illustrated in greater detail on the accompanying drawings, wherein:

FIG. 1 shows a schematic diagram of an exemplary elevator system, in accordance with at least some embodiments of the present disclosure;

FIG. 2 shows an exemplary power supply system for use in the elevator system of FIG. 1, the power supply system constructed in accordance with at least some embodiments of the present disclosure;

Figure 3:
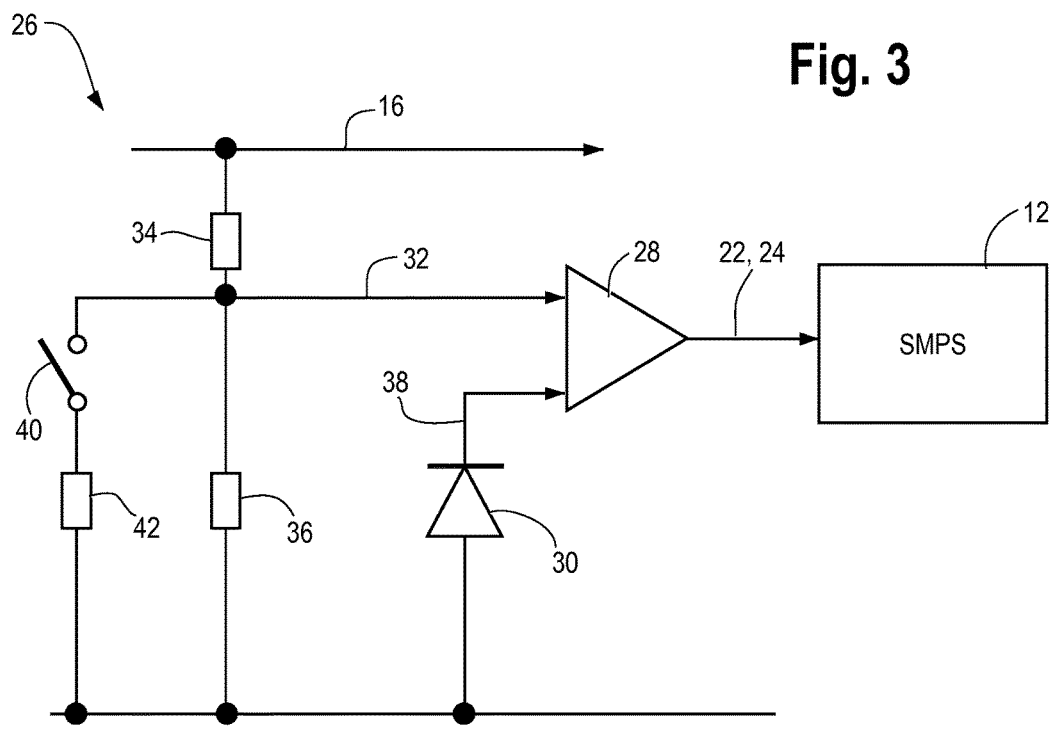
FIG. 3 shows an exemplary hardware implementation of a voltage monitor employed in the power supply system of FIG. 2.

While the following detailed description has been given and will be provided with respect to certain specific exemplary embodiments, it is to be understood that the scope of the disclosure should not be limited to such embodiments. The breadth and spirit of the present disclosure is broader than the embodiments specifically disclosed and encompassed within the claims eventually appended hereto, and their equivalents. Additionally, it is recognized that although certain features may be disclosed with specific reference to certain exemplary embodiments, the features may be incorporated into alternate embodiments where practicable.

DETAILED DESCRIPTION OF THE DISCLOSURE

Referring now to FIG. 1, a simplified schematic diagram of an elevator system 2 is shown, in accordance with at least some embodiments of the present disclosure. While all of the components of the elevator system 2 have not been shown and/or described herein, a typical elevator system may include an elevator car 4 connected to a counterweight 6 via hoisting ropes, not shown. In at least some embodiments, the hoisting ropes may extend over a traction sheave 8 driven by an electric motor within the traction sheave to move or halt the elevator car 4 as desired. The elevator system 2, with the counterweight 6, may operate in a known manner and therefore, the operation of the elevator system is not described in detail herein. The elevator system 2 may also include a power supply system 10 for providing power to the various components of the elevator system, such as the electric motor, the elevator car 4, etc. The power supply system 10 may receive power from a main power source, such a utility grid.

While not shown, it will be understood that components other than those described above, such as, elevator car frame, guide assembly, drive assembly, etc. that are used commonly in combination or conjunction with elevator systems are also contemplated and considered within the scope of the present disclosure.

Turning to FIG. 2, an exemplary schematic diagram of the power supply system 10 is shown, in accordance with at least some embodiments of the present disclosure. It will be understood that only those components of the power supply system 10 that are beneficial for a proper understanding of the present disclosure are shown and described herein. However, other components that are commonly employed with power supply systems such as transformers, rectifier, inverters, converters, etc. are contemplated and considered within the scope of the present disclosure.

As shown, the power supply system 10 may include a switch mode power supply 12 configured to provide electrical power to the elevator system 2. Specifically, the switch mode power supply (SMPS) 12 may receive an alternating current input voltage from the main power source via input power line 14 and may convert that input power into output voltage suitable for use by various components of the elevator system 2. The output voltage may be transferred to the elevator system 2 via output power line 16. For example, in at least some embodiments, the switch mode power supply 12 may receive two hundred and thirty volts of alternating current (230 VAC) via the input power line 14 and transmit an output voltage of forty eight volts of direct current (48 VDC) via the output power line 16 to the elevator system 2. In other embodiments, the input voltage to the switch mode power supply 12, as well as the output voltage therefrom may vary depending particularly upon the power rating of the region (e.g., 240 VAC, 220 VAC, etc.) where the elevator system 2 is installed, as well as the power rating of the elevator system 2.

To convert the input voltage from the main power source into the output voltage suitable for use by the elevator system 2, an exemplary one of the switch mode power supply 12 may include, among other components, rectifiers to convert the alternating current input voltage into an unregulated direct current input voltage, power transistors and inverters to convert the unregulated direct current input voltage into regulated alternating current input voltage and, one or more transformers and rectifiers to convert the alternating current input voltage into a desired output voltage. Notwithstanding the components of the switch mode power supply 12 described above, it will be understood that the description is merely that of a typical switch mode power supply. Several other components that are commonly employed in combination or conjunction with switch mode power supplies or, used instead of those described above, are contemplated and considered within the scope of the present disclosure. Further, in at least some embodiments and as may be desired or applicable, the switch mode power supply 12 may be configured to receive a direct current input voltage instead of an alternating current input voltage in which case the components of the switch mode power supply may vary to reflect the direct current input. In yet other embodiments, instead of the switch mode power supply 12, an analog power supply, other types of digital power supplies or a combination thereof may be employed as well.

In addition to the switch mode power supply 12, the power supply system 10 may also include a first voltage monitor 18 and a second voltage monitor 20. Both the first voltage monitor 18 and the second voltage monitor 20 may receive the output voltage from the output power line 16 and utilize the output voltage to determine whether the switch mode power supply 12 is functioning properly. Specifically, the first and second voltage monitors 18 and 20, respectively, may be employed to determine any failures or malfunctions in the switch mode power supply 12 that may lead the switch mode power supply to generate an abnormally higher output voltage or exceed the maximum output voltage value set by the IEC. Abnormally high output voltage is referred to generally herein as an "over-voltage condition" within the switch mode power supply 12. For example, in at least some embodiments, the switch mode power supply 12 may be configured to supply a normal output voltage of around forty eight volts of direct current (~48 VDC). In those embodiments, when the output voltage exceeds around sixty volts of direct current (~60 VDC), it may be said that the switch mode power supply has experienced an over-voltage condition.

As will be discussed further below, upon detecting an over-voltage condition at the switch mode power supply 12, the first and/or the second voltage monitors 18 and 20, respectively, may shut down the switch mode power supply, as illustrated by respective power lines 22 and 24. By virtue of shutting down the switch mode power supply 12, the first voltage monitor 18 and the second voltage monitor 20 may prevent the switch mode power supply from generating the abnormally high output voltage. Shutting down the power supply 12 may not only protect the switch mode power supply from damage, but it may also to protect the elevator system 2 from damage, as well and reduce the possibility of electric shock. Thus, the power supply system 10 by way of the first voltage monitor 18 and the second voltage monitor 20 limiting the output voltage from exceeding a particular level may provide a protective extra low voltage (PELV) in accordance with IEC standards.

Referring still to FIG. 2, the first voltage monitor 18 and the second voltage monitor 20 may independently detect the over-voltage condition at the switch mode power supply 12. By having the first voltage monitor 18 detect the over-voltage condition independent of the second voltage monitor 20, the power supply system 10 may provide a redundant switch-off mechanism such that if the first voltage monitor fails or malfunctions, the second voltage monitor may still be able to detect the over-voltage condition and turn off the switch mode power supply 12, if needed. Further, to avoid the likelihood of both the first voltage monitor 18 and the second voltage monitor 20 malfunctioning at the same time, in at least some embodiments, one of the first and second voltage monitors may be implemented in hardware (e.g., using hardware components), while the other may be implemented in software (e.g., using software modules).

Turning now to FIG. 3, a hardware implementation 26 of the first voltage monitor 18 and the second voltage monitor 20 is shown, in accordance with at least some embodiments of the present disclosure. As shown, the hardware implementation 26 may include a comparator 28 configured to compare the output voltage on the output power line 16 with a reference voltage provided through a reference diode 30. Specifically, the output voltage on the output power line 16 may be input into the comparator 28 through first input line 32 via resistors 34 and 36. Similarly, the reference voltage may be input into the comparator 28 via second input line 38. The comparator 28 may compare the voltages on the first input line 32 and the second input line 38 and output a signal on the power lines 22, 24 of the first voltage monitor 18 and the second voltage monitor 20, respectively, indicating which one of the first input line or the second input line carries a higher voltage. The output signal of the comparator 28 may be connected to control the operation of (turn on or off) the switch mode power supply 12.

Thus, for example and in at least some embodiments, if the voltage along the first input line 32 is higher than the reference voltage along the second input line 38, then the comparator 28 may output a digital high signal, which in turn may be employed to keep the switch mode power supply 12 ON. On the other hand, if the voltage along the first input line 32 is lower than the reference voltage along the second input line 38, the comparator 28 may output a digital low signal, which may be employed to turn the switch mode power supply 12 OFF. In other embodiments, the comparator 28 may use inverted signals in which case the comparator may provide a digital high signal if the voltage along the first input line 32 is lower than the reference voltage along the second input line 38 and a digital low signal when the voltage along the first input line is higher than the reference voltage along the second input line.

As explained herein, a digital high signal from the comparator 28 may indicate that no over-voltage condition at the switch mode power supply 12 exists and, therefore, the switch mode power supply may continue operation. Similarly, a digital low signal from the comparator 28 may indicate an over-voltage condition, thereby prompting the switch mode power supply 12 to turn off. While in the present embodiment, a digital high signal is used to imply no over-voltage condition and a digital low signal is used to imply an over-voltage condition, in at least some embodiments, a digital low signal may be used for no over-voltage condition while a digital high may be used to indicate an over-voltage condition.

Furthermore, the reference voltage input into the comparator via the second input line 38 may be chosen such that the reference voltage goes higher than the voltage along the first input line 32 only during an over-voltage condition at the switch mode power supply 12. Under normal operating conditions of the switch mode power supply 12, the reference voltage along the second input line 38 may remain lower than the voltage along the first input line 32. Moreover and as mentioned above, the voltage on the first input line 32 may be provided from the output power line 16 via the resistors 34 and 36. The resistors 34 and 36 may convert the output voltage from the output power line 16 into a value that the comparator 28 may be equipped to handle. The resistors 34 and 36, as well as the comparator 28 may be any be any of a variety that are commonly employed. Typically, the size and type of the resistors 34, 36 and the comparator 28 may depend upon the voltage values output by the switch mode power supply 12 during normal operating conditions and the over-voltage condition. Thus, by virtue of comparing the voltages along the first input line 32 and the second input line 38 and determining the larger voltage value, the comparator 28 may detect an over-voltage condition at the switch mode power supply 12.

The hardware implementation 26 may also include a test switch 40 that may be employed to ensure that the comparator 28 is functioning as intended to detect over-voltage conditions at the switch mode power supply 12. The comparator 28 may be tested via the test switch 40 automatically within a defined time period or, alternatively, as desired by service personnel inspecting the power supply system 10. Typically, under normal operating conditions (for example, when the comparator 28 is not being tested), the test switch 40 may remain open, as shown in FIG. 3. When the comparator 28 is to be tested (again, either automatically or as desired), the test switch 40 may be closed such that instead of the resistor 34, a test voltage via resistor 42 through the test switch 40 may be provided on the first input line 32. Under the testing condition, therefore, the comparator 28 may compare the reference voltage along the second input line 38 against the test voltage via the resistor 42 on the first input line 32 and determine the greater one of the voltages. In at least some embodiments, the test voltage may be of a value that simulates the value of the output voltage during an over-voltage condition at the switch mode power supply 12.

Figure 4:
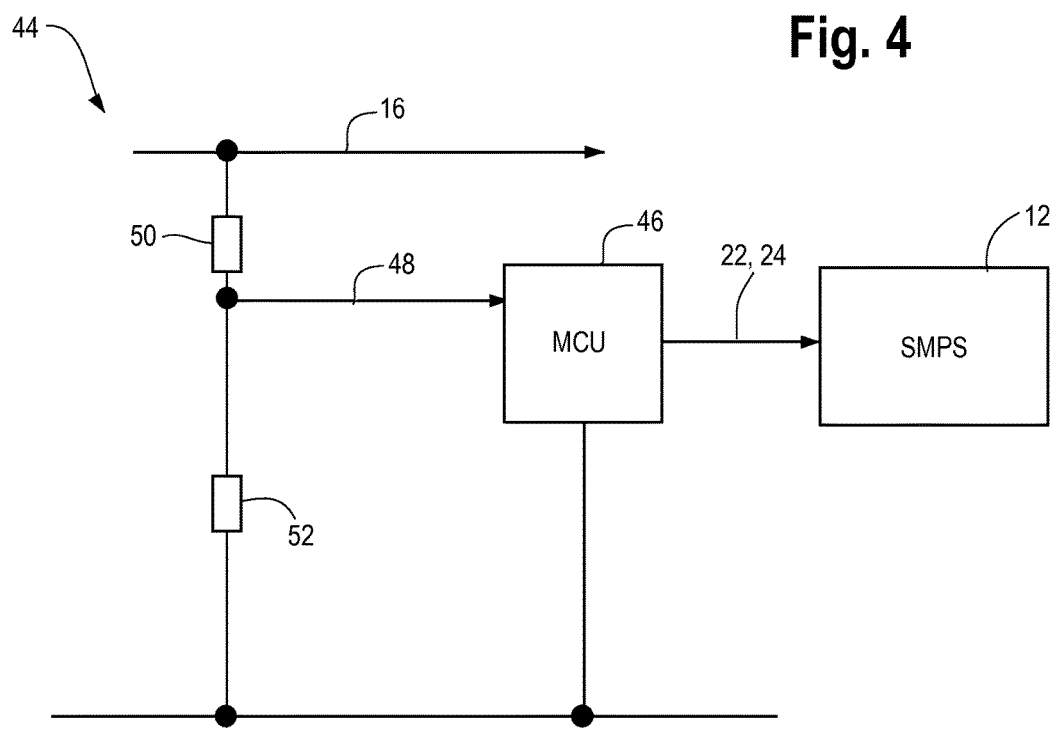
FIG. 4 shows an exemplary software implementation of the voltage monitor of FIG. 3.

Turning now to FIG. 4, a software implementation 44 of the first voltage monitor 18 and the second voltage monitor 20 is shown, in accordance with at least some embodiments of the present disclosure. As shown, the software implementation 44 may include a micro control unit 46 instead of the comparator 28 to detect over-voltage conditions at the switch mode power supply 12. Specifically, the micro control unit 46 may receive the output voltage from the output power line 16 along input line 48 via resistors 50 and 52. Upon receiving the output voltage, the micro control unit 46 may compare the output voltage against a reference voltage similar to the comparator 28 to determine if the output voltage along the input line 48 is higher than the reference voltage. The reference voltage may be programmed within the micro control unit 46.

Thus in at least some embodiments, if the micro control unit 46 determines that the reference voltage is higher than the voltage along the input line 48, then the micro control unit may output a digital low signal along power lines 22, 24 of the first voltage monitor 18 and the second voltage monitor 20, respectively, to turn the switch mode power supply 12 OFF. On the other hand, if the micro control unit 46 determines that the reference voltage is lower than the output voltage along the input line 48, then the micro control unit may output a digital high signal to keep the switch mode power supply ON.

The micro control unit 46 may be a stand-alone embedded or general purpose computer system having a processing unit and any of a variety of volatile or non-volatile memory/storage devices (not shown) such as, flash memory, read only memory (ROM), programmable read only memory (PROM), erasable programmable read only memory (EPROM), electronically erasable programmable read only memory (EEPROM), etc. The micro control unit 46 may also be configured for computer readable media, such as, joy sticks, flash drives, optical disc drives, floppy discs, magnetic tapes, drums, cards, etc., as well as output and display devices such as monitors and printers, as may be desired. Other types of computing, processing, as well as reporting and storage devices may be present within (or used in conjunction with) the micro control unit 46. Furthermore, the micro control unit 46 may run one or more software programs or applications stored in a memory location, read from a computer readable medium, and/or accessed from an external device operatively coupled to the security computer system by any suitable communication network.

In at least some embodiments, the micro control unit 46 may include an analog-to-digital converter, not shown, for converting the analog output voltage from the input line 48 into a digital voltage value for comparing against the reference voltage. The micro control unit 46 may also include software modules for comparing the voltage along the input line 48 with the reference voltage, as well as a testing module for testing the functionality of the micro control unit. Other components that may commonly be employed in combination or conjunction with micro control units are also contemplated and considered within the scope of the present disclosure.

INDUSTRIAL APPLICABILITY

In general, the present disclosure sets forth a power supply system 10 having a switch mode power supply 12 providing power to an elevator system 2. The power supply system 10 may also include a first voltage monitor 18 to detect an over-voltage condition at the switch mode power supply 12 and to turn the switch mode power supply off in case of the over-voltage condition. The power supply system 10 may additionally include a second voltage monitor 20 also configured to detect and turn off the switch mode power supply 12 in over-voltage conditions. The second voltage monitor 20 may provide a redundant switch-off path for the switch mode power supply 12 in case the first voltage monitor 18 fails.

Figure 5:
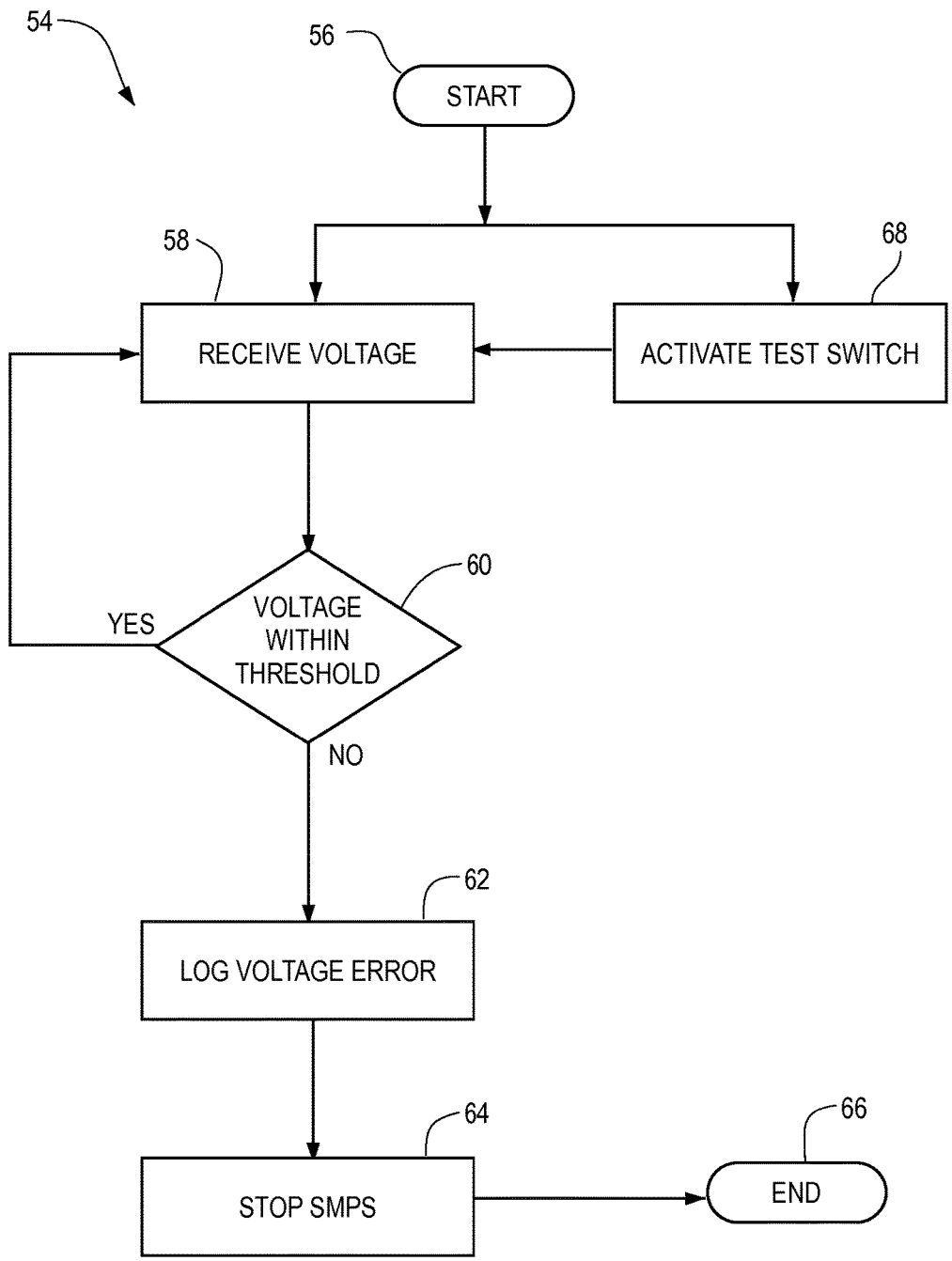
FIG. 5 shows an exemplary flowchart outlining the steps for preventing an over-voltage condition in the power supply system of FIG. 2 using the voltage monitor of FIGS. 3 and 4.

Turning now to FIG. 5, a flowchart 54 outlining the steps of detecting and limiting an over-voltage condition at the switch mode power supply 12 is shown, in accordance with at least some embodiments of the present disclosure. As shown and after starting at a step 56, the output voltage from the switch mode power supply 12 along the output power line 16 may be input into the first voltage monitor 18 and the second voltage monitor 20 at a step 58. As discussed above, the first voltage monitor 18 and the second voltage monitor 20 may operate independently and exclusively from one another to detect an over-voltage condition at the switch mode power supply 12. Again, by virtue of operating independently, the second voltage monitor 20 may provide a redundant switch off path, thereby ensuring that the over-voltage condition at the switch mode power supply 12 may be detected even if the first voltage monitor 18 malfunctions. Furthermore, to improve reliability and to reduce the chances of both the first and the second voltage monitors 18 and 20, respectively, malfunctioning at the same time, one of the first or the second voltage monitors may be implemented in hardware while the one of the voltage monitor may be implemented in software. In at least some embodiments, the first voltage monitor 18 may be implemented in hardware and the second voltage monitor 20 may be implemented in software.

Upon receiving the output voltage from the switch mode power supply 12 at the step 58, at a step 60, the first voltage monitor 18 and the second voltage monitor 20 may independently determine whether the output voltage exceeds a pre-determined threshold voltage. For example, in at least some embodiments, the pre-determined threshold may be set at sixty volts of direct current (60 VDC). In other embodiments, the pre-determined threshold may vary depending upon several factors, such as, the size and type of the elevator system 2, the region where the elevator system may be installed, the power rating of the elevator system and the maximum value set by the International Electrotechnical Commission (IEC).

The first voltage monitor 18 and the second voltage monitor 20 may determine whether the output voltage from the switch mode power supply 12 exceeds the pre-determined threshold voltage by comparing the output voltage against a reference voltage, as discussed above. In at least some embodiments, the output voltage may exceed the pre-determined threshold when the output voltage is lower than the reference voltage. Further, as discussed above, in a hardware implementation of the first voltage monitor 18 and the second voltage monitor 20, the comparison of the output voltage against the reference voltage may be performed using the comparator 28. Similarly, in a software implemented version of the first voltage monitor 18 and the second voltage monitor 20, the micro control unit 46 may compare the output voltage against the reference voltage.

If, after comparing the output voltage with the reference voltage, the first voltage monitor 18 and/or the second voltage monitor 20 determine that the output voltage exceeds the pre-determined threshold, thereby indicating an over-voltage condition at the switch mode power supply 12, then at a step 62, that voltage monitor may log an error in the power supply system 10. The first and/or the second voltage monitors 18 or 20, respectively, that detected the over-voltage condition may also turn the switch mode power supply 12 off at a step 64 until the switch mode power supply may be repaired or replaced and deemed fit for further operation. The process may then end at a step 66.

On the other hand, if at the step 60, the first voltage monitor 18 and the second voltage monitor 20 both determine that the output voltage does not exceed the pre-determined threshold indicating no over-voltage condition at the switch mode power supply 12, then the process may go back to the step 58 and continue monitoring the output voltage from the switch mode power supply.

Further and as indicated above, to improve the reliability of the first voltage monitor 18 and the second voltage monitor 20, those voltage monitors may be periodically tested. To test the hardware implementation 26 of the first voltage monitor 18 and/or the second voltage monitor 20, the test switch 40 may be closed at a step 68 such that instead of the output voltage from the switch mode power supply 12, the comparator 28 may receive the test voltage across the test switch 40 as input. In some embodiments, the test voltage may be designed to simulate the output voltage from the switch mode power supply 12. After closing the test switch 40, the testing may proceed as outlined above in steps 58-64. Specifically, the first voltage monitor 18 and the second voltage monitor 20 may compare the test voltage against the reference voltage and determine whether the test voltage exceeds a pre-determined threshold. If the test voltage exceeds the threshold, then an error may be logged and the switch mode power supply 12 may be turned off.

By virtue of using the first voltage monitor 18 and the second voltage monitor 20 to detect over-voltage at the switch mode power supply 12, the present disclosure provides a mechanism to provide protective extra low voltage to the elevator system 2 in compliance with the standards set by the IEC. Further, the mechanism ensures a compact and efficient design of the power supply system 10.

While only certain embodiments have been set forth, alternatives and modifications will be apparent from the above description to those skilled in the art. These and other alternatives are considered equivalents and within the spirit and scope of this disclosure and the appended claims.

What is claimed is:

1. An elevator system, comprising:
   an elevator car; and
   a power supply system configured to supply protective extra low voltage to the elevator car, the power supply system having a switch mode power supply configured to provide an output voltage to the elevator car, a first voltage monitor and a second voltage monitor, the first and the second voltage monitors configured to detect an over-voltage condition at the switch mode power supply and turn the switch mode power supply off if the over-voltage condition is detected.

2. The elevator system of claim 1, wherein the first voltage monitor and the second voltage monitor compare the output voltage against a reference voltage to determine the over-voltage condition at the switch mode power supply.

3. The elevator system of claim 1, wherein one of the first voltage monitor and the second voltage monitor is implemented using a comparator and the other one of the first voltage monitor and the second voltage monitor is implemented using a micro control unit.

4. The elevator system of claim 3, wherein the first voltage monitor is implemented using the comparator and the second voltage monitor is implemented using the micro control unit.

5. The elevator system of claim 1, wherein the first voltage monitor includes a comparator configured to receive the output voltage and a reference voltage and output a signal indicating the higher one of the output voltage and the reference voltage.

6. The elevator system of claim 1, wherein the second voltage monitor includes a comparator configured to compare the output voltage against a reference voltage and, output a signal indicating the higher one of the output voltage and the reference voltage.

7. The elevator system of claim 1, wherein the first voltage monitor includes a micro control unit configured to compare the output voltage against a reference voltage and, output a signal indicating the higher one of the output voltage and the reference voltage.

8. The elevator system of claim 1, wherein the second voltage monitor includes a micro control unit configured to compare the output voltage against a reference voltage and, output a signal indicating the higher one of the output voltage and the reference voltage.

9. The elevator system of claim 1, wherein the first voltage monitor includes a test switch configured to input a test voltage into the first voltage monitor when the test switch is closed, the test voltage configured to simulate the over-voltage condition at the switch mode power supply.

10. The elevator system of claim 1, wherein the second voltage monitor includes a test switch configured to input a test voltage into the second voltage monitor when the test switch is closed, the test voltage configured to simulate the over-voltage condition at the switch mode power supply.

11. The elevator system of claim 1, wherein the switch mode power supply is connected to a main power supply, the switch mode power supply configured to convert power from the main power supply into the output voltage.

12. The elevator system of claim 1, wherein the second voltage monitor provides a redundant switch off path to the switch mode power supply if the first voltage monitor malfunctions.

13. The elevator system of claim 1, wherein the first voltage monitor and the second voltage monitor prevent the output voltage from going over approximately sixty volts of direct current.

* * * * *